(12) United States Patent
Dooper et al.

(10) Patent No.: US 7,965,141 B2
(45) Date of Patent: Jun. 21, 2011

(54) CLASS D AUDIO AMPLIFIER

(75) Inventors: Lutsen Dooper, Brummen (NL); Marco Berkhout, Tiel (NL)

(73) Assignee: NXP B.V., Eindhoven (NL)

( * ) Notice: Subject to any disclaimer, the term of this patent is extended or adjusted under 35 U.S.C. 154(b) by 183 days.

(21) Appl. No.: 12/307,457

(22) PCT Filed: Jul. 4, 2007

(86) PCT No.: PCT/IB2007/052614
§ 371 (c)(1),
(2), (4) Date: Jan. 5, 2009

(87) PCT Pub. No.: WO2008/007308
PCT Pub. Date: Jan. 17, 2008

(65) Prior Publication Data
US 2009/0315623 A1 Dec. 24, 2009

(30) Foreign Application Priority Data
Jul. 7, 2006 (EP) .................... 06116800

(51) Int. Cl.
*H03F 1/04* (2006.01)
(52) U.S. Cl. ................. 330/207 A; 330/251; 330/10
(58) Field of Classification Search .......... 330/207 A, 330/251, 10
See application file for complete search history.

(56) References Cited

U.S. PATENT DOCUMENTS

| | | | | |
|---|---|---|---|---|
| 5,075,634 A * | 12/1991 | French | | 330/146 |
| 5,389,829 A | 2/1995 | Milazzo | | |
| 5,506,532 A * | 4/1996 | Milazzo | | 327/175 |
| 5,838,210 A | 11/1998 | Midya et al. | | |
| 6,016,075 A * | 1/2000 | Hamo | | 330/10 |
| 6,229,389 B1 | 5/2001 | Pullen et al. | | |
| 6,320,465 B1 * | 11/2001 | Masini et al. | | 330/207 A |
| 6,577,186 B2 | 6/2003 | Berkhout | | |
| 7,088,177 B2 * | 8/2006 | Lind | | 330/207 A |
| 2003/0122605 A1 | 7/2003 | Ulrick et al. | | |
| 2005/0083114 A1 | 4/2005 | Risbo | | |

FOREIGN PATENT DOCUMENTS

| | | |
|---|---|---|
| EP | 0184280 A1 | 6/1986 |
| EP | 1049248 A | 11/2000 |
| WO | 0022727 A | 4/2000 |
| WO | 20041047299 A1 | 6/2004 |
| WO | 2004073161 A1 | 8/2004 |

* cited by examiner

*Primary Examiner* — Patricia Nguyen

(57) ABSTRACT

A class D amplifier (1) comprises an input unit (11) for receiving a digital input signal (Vin), a pulse shaping unit (12) for producing pulse shaped signals in dependence of the input signal (Vin), a comparator unit (13) for comparing the pulse shaped signals and producing a comparator signal, a driver unit (14) for producing driver signals in dependence of the comparator signal, a switching output unit (15) for producing a pulse width modulated output signal (Vout) in dependence of the driver signals, and a feedback unit (16) for feeding the output signal (Vout) back to the pulse shaping unit (12). The input unit (11) comprises a clipping control unit (10) for controlling the duty cycle of the pulse width modulated output signal (Vout).

10 Claims, 4 Drawing Sheets

CLASS D AUDIO AMPLIFIER

FIELD OF THE INVENTION

The present invention relates to an audio amplifier. More in particular, the present invention relates to a class D amplifier which is capable of producing a pulse width modulated output signal.

BACKGROUND OF THE INVENTION

In a class D amplifier, the output stage is used as a switch for switching the output signal between a positive and a negative supply voltage in dependence of an input signal. The resulting output signal is therefore a pulse width modulated bipolar signal which may be demodulated by a demodulation filter and then be made audible by a loudspeaker.

The switching of the output stage typically switches one transistor of a pair of output transistors on while switching the other transistor off. When one of the output transistors is off, its current and hence its power dissipation are zero, resulting in a high efficiency, and relatively low power and cooling requirements.

Class D amplifiers are typically provided with an integrating analog feedback loop to reduce any distortion introduced by the output stage. To this end, the output signal is typically fed back to a pulse shaping circuit so as to adjust the pulse shaping in dependence of the output signal.

However, the gain of the feedback loop influences the modulation depth of the output signal. When the supply voltage decreases, for example, the feedback loop will adjust the pulse width (and hence the modulation depth) to compensate for the amplitude loss. This may cause the output signal of the amplifier to have a greater modulation depth than the input signal. Ultimately, the increased modulation depth may cause the output signal to clip to the supply voltage and stop changing sign. The integrator(s) involved in the feedback loop will then drift away from their normal operating range and also clip to a supply voltage. A class D amplifier is typically slow to recover from this condition, and the demodulated output signal may initially be distorted when the duty cycle returns to normal operating values.

U.S. Pat. No. 6,577,186 (Berkhout/Philips) discloses a class D amplifier comprising a pulse width modulation stage and a switching stage. An oscillator provides a clock signal to a second integrator of the pulse width modulation stage, while a feedback loop feeds the output signal back to a first integrator of the pulse width modulation stage. To prevent or limit clipping, a pulse width modulation limiter is provided to effectively limit the modulation depth. This Prior Art pulse width modulation limiter is arranged between the pulse width modulation stage and the switching stage, and receives both the comparator signal and the clock signal to produce a minimum width output pulse on an edge of the clock signal. These minimum width output pulses ensure that a carrier frequency is always present in the output signal, and allow any bootstrap capacitors present in the switching output unit to be recharged regularly, thus ensuring a proper functioning of the switching output unit.

Although the arrangement of U.S. Pat. No. 6,577,186 operates well, its use is limited to class D amplifiers having a clock generator. It has been found that a clock generator can be dispensed width if the input signal is a digital signal, for example a PDM (Pulse Density Modulation) signal or a PWM (Pulse Width Modulation) signal. In addition, this Prior Art solution effectively forces the output to change sign but still allows the integrators to run away, thus only offering a partial solution to the problem.

OBJECT AND SUMMARY OF THE INVENTION

It is an object of the present invention to overcome these and other problems of the Prior Art and to provide a class D amplifier of which the output signal is guaranteed to change sign while controlling the behavior of the pulse shaping unit.

Accordingly, the present invention provides a class D amplifier as claimed in claim 1.

By providing a clipping control unit that controls the input signal, it can be ensured that the amplifier remains functioning properly, even at very high or very low duty cycles. That is, the clipping control unit causes the entire amplifier to work in its normal operating range. As a result, it is ensured that the output signal keeps changing sign. Although clipping (that is, the demodulated output signal reaching the supply voltage) cannot always be prevented, the regular sign change allows a demodulation of the output signal.

An advantage of the class D amplifier according to the invention is that any integrator that may be part of the feedback loop remains in its normal operating range, providing a much improved clipping recovery. Furthermore, any bootstrap capacitor that may be present in the amplifier for generating the pulse width modulated output signal is recharged regularly.

A further advantage of the class D amplifier according to the invention is that no oscillator is required for providing a clock frequency as it is arranged for receiving a digital input signal. It is further noted that the amplifier may also be adapted for receiving an analog input signal if a suitable A/D (analog/digital) converter is provided. The digital input signal may, for example, be a PDM (Pulse Density Modulation) or PWM (Pulse Width Modulation) input signal.

As mentioned above, the clipping control unit, that is preferably located near the input of the amplifier, is designed for limiting the duty cycle of the pulse width modulated output signal by controlling the duty cycle of the input signal. Although this may be achieved in various ways, it is preferred that the clipping control unit is arranged for receiving an output indicator signal indicative of the output signal, and for delaying a transition of the input signal until the output indicator signal has responded to a previous transition of the input signal. In this way, it is assured that the output signal will keep changing sign. Effectively the pulse width of the input signal is adjusted to the minimum value resulting in a sign change of the output signal.

The output indicator signal mentioned above is preferably identical to, or derived from, the comparator signal. That is, preferably the comparator signal or its equivalent is received by the clipping control unit as an indicator of the output signal. Alternatively, the output indicator signal is identical to, or derived from, the output signal itself. It will be understood that the output indicator signal may be derived from the comparator signal or the output signal by voltage division or other electrical operations, or by logical operations such as inversion.

As mentioned above, the input unit of the present invention comprises a clipping control unit. The input unit may comprise additional components, such as a D/A (digital/analog) converter for converting the digital (bipolar) input signal into an analog signal that can be processed by the pulse shaping unit.

Various embodiments of the clipping control unit are possible. For example, the clipping control unit may comprise a state machine, a hysteresis loop or a logical circuit.

The pulse shaping unit may comprise at least one integrator. In a preferred embodiment, the pulse shaping unit comprises two integrators.

The amplifier of the present invention may further comprise a demodulation filter for demodulating the output signal, so as to produce an audible demodulated signal which can be rendered by a suitable transducer, such as a loudspeaker.

The present invention also provides an audio system comprising a class D amplifier as defined above, a consumer device comprising a class D amplifier as defined above, and a clipping control unit for use in the class D amplifier as defined above. The consumer device may be a portable consumer device, such as a portable CD player or DVD player.

The present invention further provides a method of driving a class D amplifier capable of receiving a digital input signal and in which the output signal is fed back to shape pulses, the method comprising the step of limiting the duty cycle of the pulse width modulated output signal by controlling the input signal.

In a preferred embodiment, the method of the present invention comprises the steps of receiving an output indicator signal indicative of the output signal, and delaying a transition of the input signal until the output indicator signal has responded to a previous transition of the input signal.

BRIEF DESCRIPTION OF THE DRAWINGS

The present invention will further be explained below with reference to exemplary embodiments illustrated in the accompanying drawings, in which.

DESCRIPTION OF EMBODIMENTS

Figure 1:
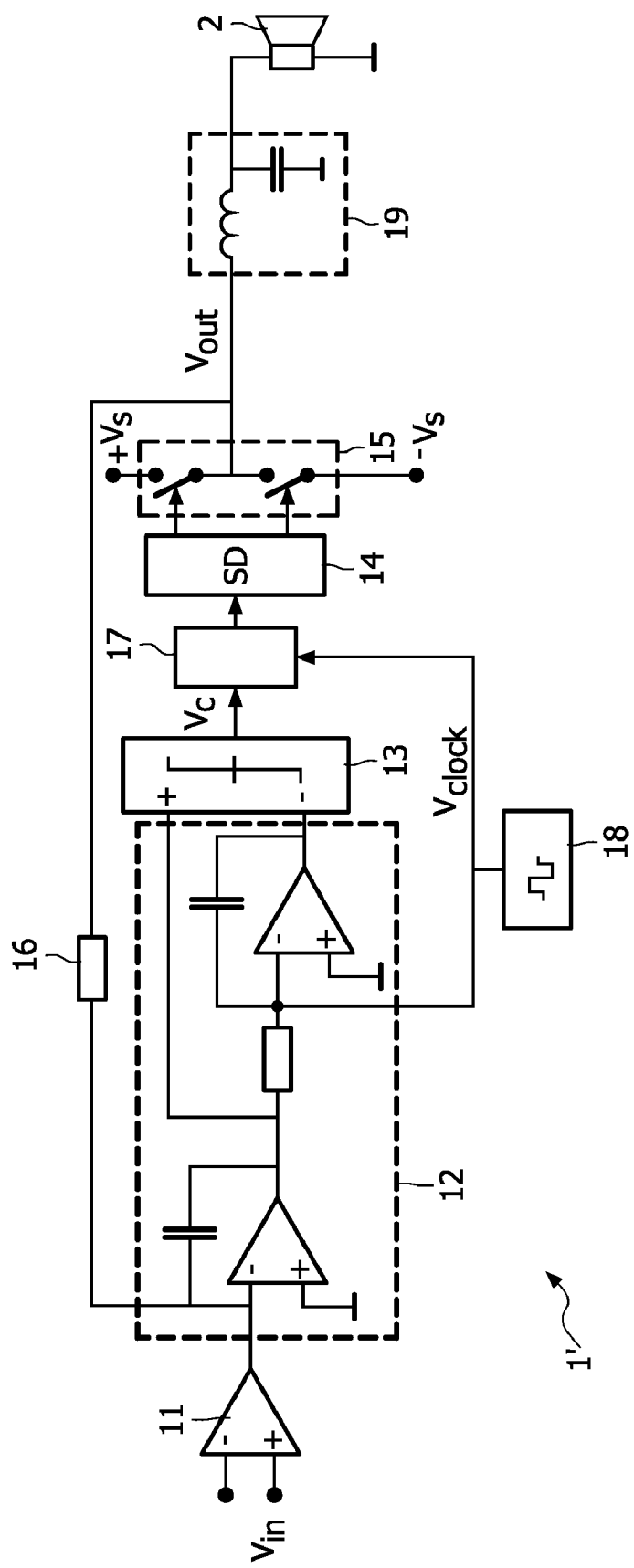
FIG. 1 schematically shows an exemplary class D amplifier according to the Prior Art.

The Prior Art class D amplifier 1' shown in FIG. 1 comprises an input unit 11, a pulse shaping unit 12, a comparator unit 13, a driver unit 14, a switching output unit 15, a feedback resistor 16, a pulse width modulation limiter 17, and an oscillator (clock pulse generator) 18. The output of the amplifier 1' is coupled to a demodulation filter 19, which in turn is coupled to a loudspeaker 2. The amplifier 1' is discussed in more detail in U.S. Pat. No. 6,577,186 mentioned above.

In the amplifier 1' the input unit 11 converts an analog input voltage into an analog input current. The pulse width modulation unit 12 comprises two integrators, each constituted by an opamp and a capacitor, the output of each integrator being coupled to a respective input of the comparator unit 13. A clock signal generated by the oscillator 18 is fed to the input of the second integrator.

Between the comparator unit 13 and the driver unit 14 a pulse width modulation limiter 17 is interposed, which serves to limit the modulation width. The pulse width modulation limiter 17 also receives the clock signal from the oscillator 18, and supplies an adjusted comparator signal to the driver unit 14. This driver unit 14 derives suitable driver signals from the adjusted comparator signal and supplies these driver signals to the switching output unit 15. Only one of the two switches of the switching output unit 15 is conductive at any time, effectively switching the output signal $V_{out}$ between the positive supply voltage $+V_s$ and the negative supply voltage $-V_s$.

The demodulation filter 19, which in the example shown consists of an inductor and a capacitor, demodulates the pulse width modulated output signal $V_{out}$ to produce an audio signal that can be rendered by the loudspeaker 2.

The digital output signal $V_{out}$ normally changes sign regularly, typically at a frequency which is an order of magnitude higher than the highest audio frequency to be reproduced. This allows any bootstrap capacitors (not shown in FIG. 1) of the switching output unit 15 to be recharged regularly. However, this recharging is only possible when the (digital) output signal $V_{out}$ continues to change sign. If the duty cycle is 0% or 100% for several pulses in succession, a recharging of such capacitors is impossible, as a result of which the switching output unit 15 will fail to operate properly.

To prevent this, the Prior Art amplifier 1' of FIG. 1 is provided with the pulse width limiter 17 which serves to provide a certain maximum pulse width of the comparator signal $V_c$ in dependence of the clock signal $V_{clock}$. Effectively, therefore, the pulse width limiter of the Prior Art corrects the comparator signal $V_c$. If the comparator signal $V_c$ needs to be corrected, the previous stage, in the present example the pulse width unit 12, must have yielded an incorrect pulse width. This is most likely caused by one or both integrators of the pulse width unit 12 failing to return to a normal operating value. Instead, the output voltage of an integrator may reach and stay at a supply voltage, causing an incorrect pulse width of the comparator signal $V_c$ and hence of the output signal $V_{out}$.

Figure 2:
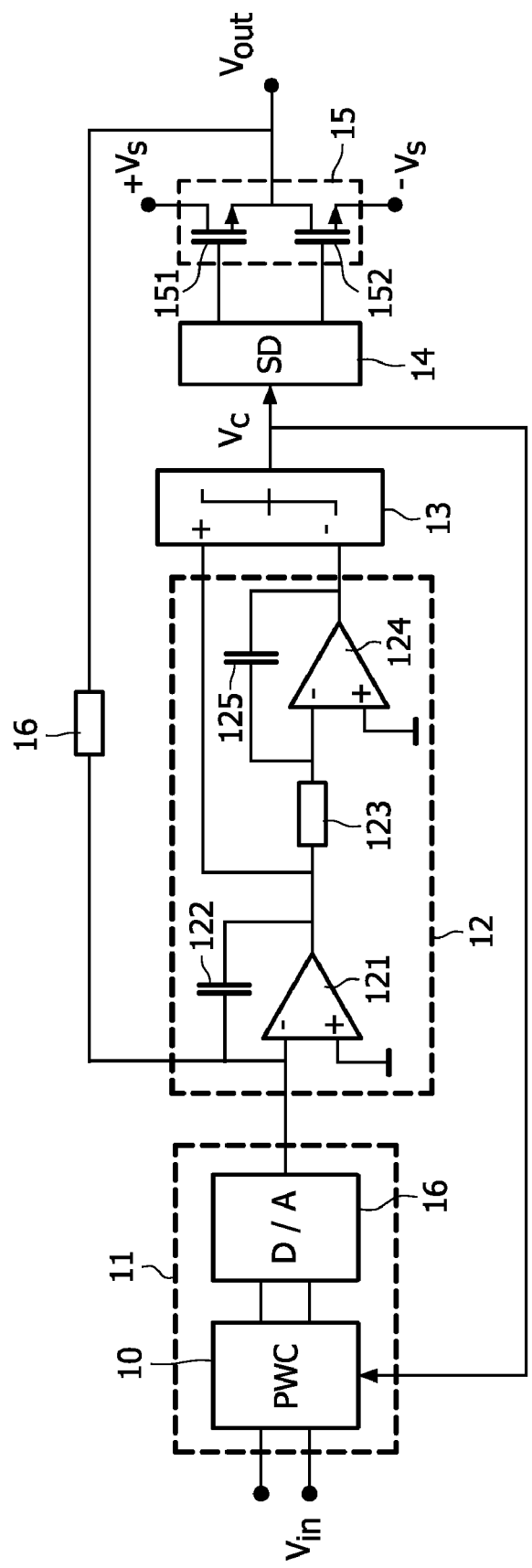
FIG. 2 schematically shows an exemplary class D amplifier according to the present invention.

In the present invention, any incorrect behavior of the pulse shaping unit is prevented by controlling the input signal instead of the comparator signal. This is illustrated in FIG. 2, where a pulse width control (PWC) unit 10 is accommodated in the input unit 11. By controlling the input signal, as will later be explained in more detail, any undesired pulse widths are eliminated at the earliest stage possible, before they can adversely affect the operation of any integrators of the pulse shaping unit.

As illustrated in FIG. 2, the class D amplifier 1 of the present invention comprises an input unit 11 for receiving a digital input signal $V_{in}$, a pulse shaping unit 12 for producing pulse shaped signals in dependence of the input signal $V_{in}$, a comparator unit 13 for comparing the pulse shaped signals and producing a comparator signal, a driver unit 14 for producing driver signals in dependence of the comparator signal $V_c$, a switching output unit 15 for producing a pulse width modulated output signal $V_{out}$ in dependence of the driver signals, and a feedback unit 16 for feeding the output signal $V_{out}$ back to the pulse shaping unit 12.

The switching output unit 15 comprises, in the embodiment shown, two MOSFETs (Metal Oxide Silicon Field Effect Transistors) arranged in series. These transistors can be driven so as to conduct alternatingly and thereby make the output signal $V_{out}$ alternatingly equal, or substantially equal, to the positive supply voltage $+V_s$ and the negative supply voltage $-V_s$. Those skilled in the art will realize that alternative switching output units are possible, for example units in which a so-called bridge arrangement of four transistors is used.

It can be seen that the feedback unit consists of a resistor 16 coupled between the output of the switching output unit 15 and the input of the pulse shaping circuit 12 so as to feed back the output signal $V_{out}$. Instead of the resistor 16 an alternative circuit could be used, for example a filter circuit.

The pulse shaping unit 12 comprises, in the exemplary embodiment shown in FIG. 2, two integrators arranged in series. However, alternative embodiments can be envisaged in which the pulse shaping unit 12 comprises only a single integrator, or in which alternative circuitry is used to produce suitably shaped pulses.

The input unit 11, which serves to receive the input signal $V_{in}$, comprises in the embodiment shown a D/A (digital/analog) converter 16 for converting the digital (bipolar) input signal $V_{in}$ into an analog signal that can be processed by the pulse shaping unit 12. In accordance with the present invention, the input unit 11 also comprises a pulse width control (PWC) unit 10 for limiting the duty cycle of the pulse width modulated output signal $V_{out}$ by controlling the input signal $V_{in}$. This is achieved by comparing the edges of the input signal $V_{in}$ and the comparator signal $V_c$ produced by the comparator 13.

If the input signal $V_{in}$ changes from low ("$-V_{in}$") to high ("$+V_{in}$"), a rising edge occurs in this signal. After a short delay caused by the intermediary circuitry, a corresponding falling edge should occur in the comparator signal $V_c$ (the amplifier causes an inversion of the comparator signal $V_c$ relative to the input signal $V_{in}$). If the input signal changes back from high to low (falling edge) before the said falling edge has occurred in the comparator signal, it is possible that the short pulse in the input signal will not be reflected in the output signal. In other words, the input signal may have changed sign twice (one rising and one falling edge), without any sign change in the comparator signal and hence in the output signal. As discussed above, this is clearly undesirable.

For this reason, the pulse width control (PWC) unit 10 "stretches" any pulse in the input signal $V_c$ until the comparator signal $V_c$ (or, alternatively, the output signal $V_{out}$) has changed sign. In other words, the pulse width control unit 10 of the present invention delays any sign change of the input signal until the comparator signal has followed the previous sign change. In most instances, no delay will need to be introduced as the input signal pulse duration will be greater than the inherent delay of the pulse shaping circuit 12 and the comparator 13. However, in the case of extremely short pulses a delay will be introduced to ensure that these short pulses will be reproduced by the switching output stage of the amplifier 1. The pulse width control (PWC) unit 10 may also be referred to as a clipping control unit, as it controls the clipping behavior of the amplifier 1. Effectively, the PWC unit 10 controls (that is, modifies if necessary) the modulation depth (and hence the duty cycle) of the input signal before it is fed to the pulse shaping unit 12, so as to control the modulation depth (and hence the duty cycle) of the output signal and thereby control the clipping behavior of the amplifier.

It is noted that the amplifier 1 of the present invention does not require a clock pulse generator (oscillator 18 in FIG. 1), as the digital input signal already supplies sufficient timing information. However, embodiments can be envisaged in which an oscillator is used, for example when an analog input signal is received. In such embodiments, the comparator signal $V_c$, or a signal derived from the output signal $V_{out}$, may still be fed to a clipping control unit arranged at the input of the amplifier.

It is further noted that the switching output unit of the amplifier 1 may comprise a bootstrap capacitor, which is not shown in FIG. 2 for the sake of clarity of the illustration. This bootstrap capacitor serves as a floating power supply for the transistor 151 when this transistor is made conductive. If the output signal $V_{out}$ fails to change sign regularly, as may be the case in conventional class D amplifiers, this bootstrap capacitor will not be recharged, and the switching output stage may cease to function properly. In the amplifier of the present invention, it is guaranteed that the output signal will keep changing sign and that the bootstrap capacitor will be recharged.

Figure 3:
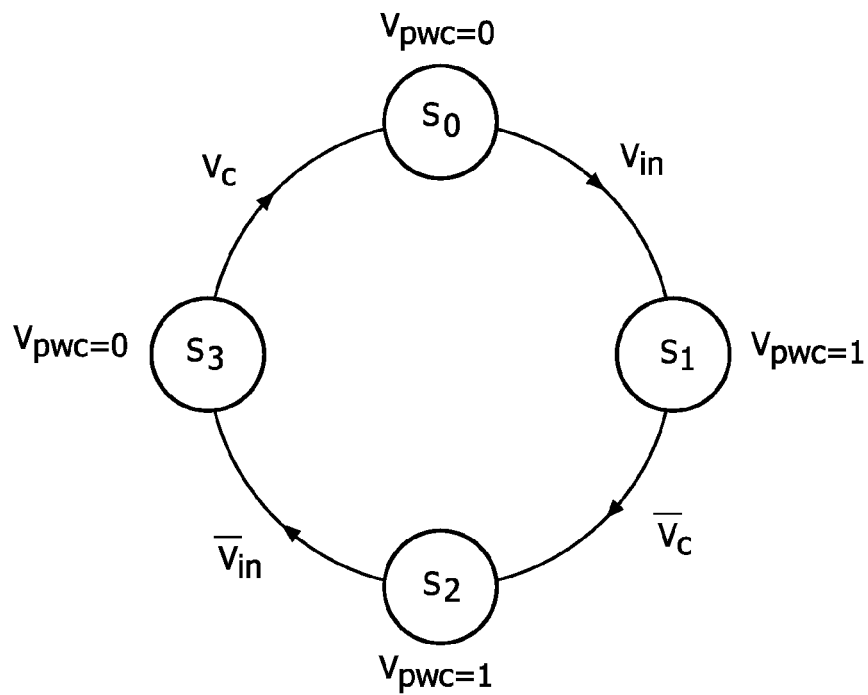
FIG. 3 schematically shows the operation of a pulse width control unit according to the present invention.

The operation of the pulse width control (PWC) unit 10 is illustrated in FIG. 3 by way of a state diagram. In state $S_0$ the output signal $V_{pwc}$ of the pulse width control unit 10 is low ($V_{pwc}=0$). If the input signal $V_{in}$ becomes high ($V_{in}=1$), the unit jumps to state $S_1$ and the signal $V_{pwc}$ becomes high.

In state $S_1$ the unit is insensitive to the input signal $V_{in}$ and waits for its second input signal, the comparator signal $V_c$, to become low before jumping to state $S_2$. The PWC unit output signal $V_{pwc}$ remains high ($V_{pwc}=1$). In state $S_2$ the unit is again sensitive to the (first) input signal $V_{in}$. If this input signal $V_{in}$ becomes low, the unit goes to state $S_3$ and the signal $V_{pwc}$ becomes low as well. In state $S_3$ the unit waits for the comparator signal $V_c$ to become high before returning to the original state $S_0$. This cycle is repeated indefinitely.

It can thus be seen that the PWC unit 10 waits for the comparator signal $V_c$ to change sign before changing its output signal $V_{pwc}$ in response to a change in the input signal $V_{in}$. Those skilled in the art will realize that a state machine may be embodied by suitable hardware circuits.

Figure 4:
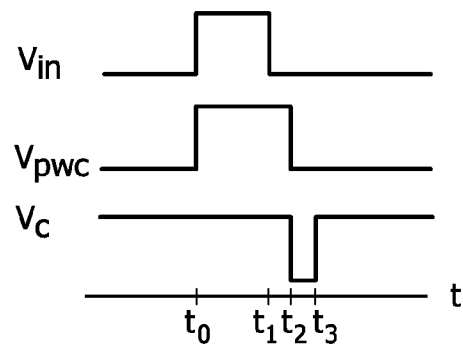
FIG. 4 schematically shows time signals as controlled by a pulse width control unit according to the present invention.
Figure 5:
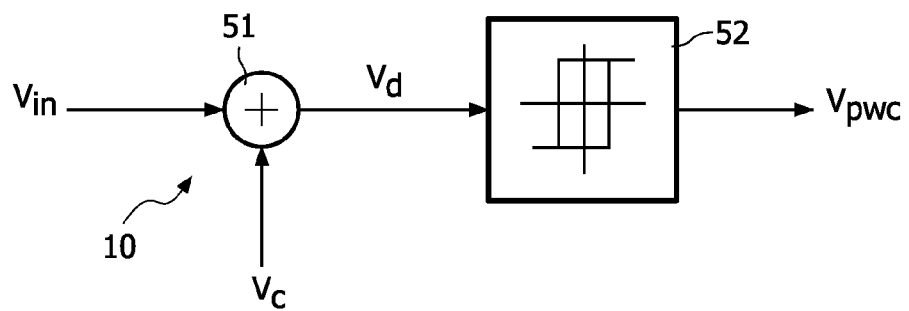
FIG. 5 schematically shows an embodiment of a pulse width control unit according to the present invention.

This is further illustrated in FIG. 4, where the various time signals are shown. Initially, the input signal $V_{in}$ and the clipping control unit output signal $V_{pwc}$ are low (signal level –1), while the comparator signal $V_c$ is high (signal level +1). At time instant $t_0$, the input signal $V_{in}$ exhibits a rising edge and becomes high (+1). This causes the output signal $V_{pwc}$ of the unit 10 to go high (+1) as well. At $t_1$, the input signal $V_{in}$ becomes low again (signal level –1). However, the comparator signal $V_c$ has not changed sign yet and is still high (+1). In accordance with the present invention, the output signal $V_{pwc}$ of the unit 10 remains high until the comparator signal $V_c$ becomes low.

After some delay, the comparator signal $V_c$ goes low (–1) at time instant $t_2$ (transition from state $S_1$ to state $S_2$ in FIG. 3). Now the clipping unit output signal $V_{pwc}$ goes low as well. Effectively, the input pulse has been "stretched" so that the comparator (13 in FIG. 2) could follow. At $t_3$, the comparator signal $V_c$ goes high again in response to the falling edge of $V_{pwc}$ at $t_2$.

The PWC unit 10 can be embodied using a hysteresis loop instead of a state machine. In this embodiment, the unit 10 comprises a adder 51 and a hysteresis unit 52. The adder 51 receives the input signal $V_{in}$ and the comparator signal $V_c$. In this embodiment, it is assumed that a high signal level is +1 and a low signal level is –1. Those skilled in the art will realize that the hysteresis loop depicted at 52 represents the output signal $V_{pwc}$ (vertical axis) as a function of the signal $V_d$ (horizontal axis), and that $V_{pwc}$ cycles through the hysteresis loop in the anti-clockwise direction.

If initially $V_{in}$ is low (–1) and $V_c$ is high (+1), the resulting signal $V_d$ equals 0 (memory mode of the hysteresis unit 52) and the clipping control (or pulse width control) unit output signal $V_{pwc}$ remains low (–1). This corresponds to the situation prior to $t_0$ in FIG. 4. When $V_{in}$ becomes high (+1), $V_d$ equals +2 and the hysteresis unit 52 outputs a signal $V_{pwc}$ equal to high (+1), as at $t_0$ in FIG. 4 (switch mode). When $V_{in}$ goes low (−1) at $t_1$, $V_d$ becomes 0 again (memory mode) and $V_{pwc}$ remains high (+1). Subsequently, when $V_c$ goes low at $t_2$, $V_d$ becomes −2 and $V_{pwc}$ switches to low (−1). At $t_3$, when $V_c$ returns to high, $V_d$ becomes 0 (memory mode) and $V_{pwc}$ remains low (−1).

Figure 6:
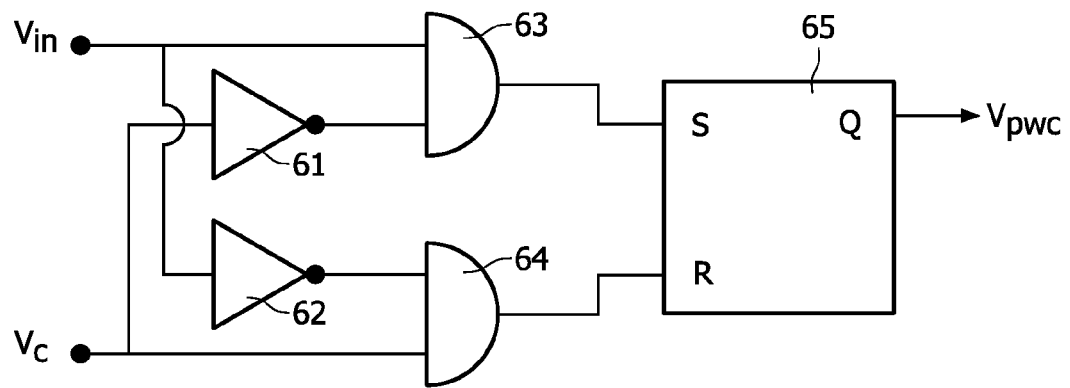
FIG. 6 schematically shows an alternative embodiment of a pulse width control unit according to the present invention.

Alternatively, the PWC unit 10 can be embodied as a logic circuit, involving inverters, AND-gates and a flip-flop, as illustrated in FIG. 6. The input signal $V_{in}$ and the inverse (inverter 61) of the comparator signal $V_c$ are fed to a first AND-gate 63, the output of which is high when $V_{in}$ is high and $V_c$ is low. Similarly, the inverse (inverter (62) of the input signal $V_{in}$ and the comparator signal $V_c$ are fed to a first AND-gate 63, the output of which is high when $V_{in}$ is low and $V_c$ is high. The signals produced by the AND-gates 63 and 64 are fed to the S-input and R-input of an S-R flipflop 65. The output Q yields the signal $V_{pwc}$.

Figure 7:
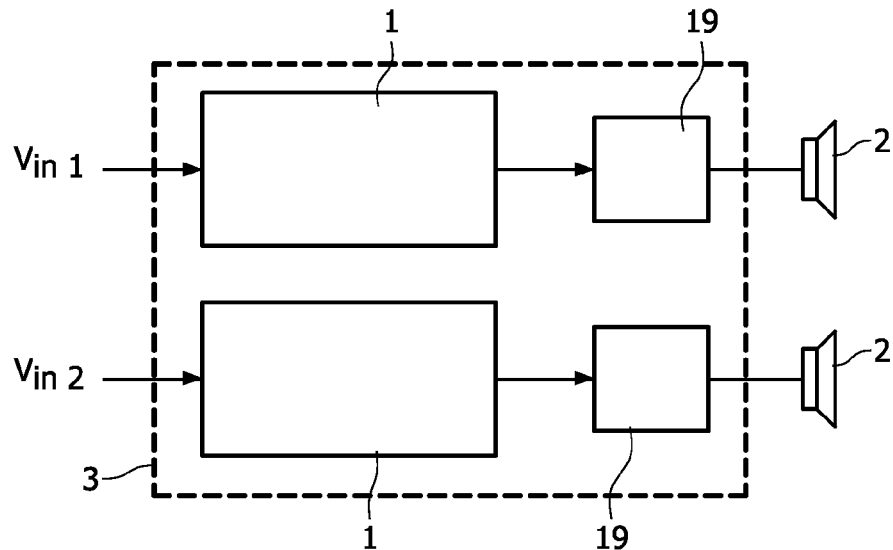
FIG. 7 schematically shows an audio system according to the present invention.

The audio system 3 according to the present invention which is shown schematically in FIG. 7 comprises two class D amplifiers 1 receiving input signals $V_{in1}$ and $V_{in2}$ respectively. Demodulation filters 19 demodulate the output signals of the amplifiers 1 and feed the demodulated signals to a respective loudspeaker 2. The audio system 3 may optionally comprise A/D converters for converting analog input signals into digital input signals ($V_{in1}$ and $V_{in2}$). The audio system may further comprise sound sources (such as a DVD station), additional amplifiers and additional loudspeakers (not shown).

Figure 8:
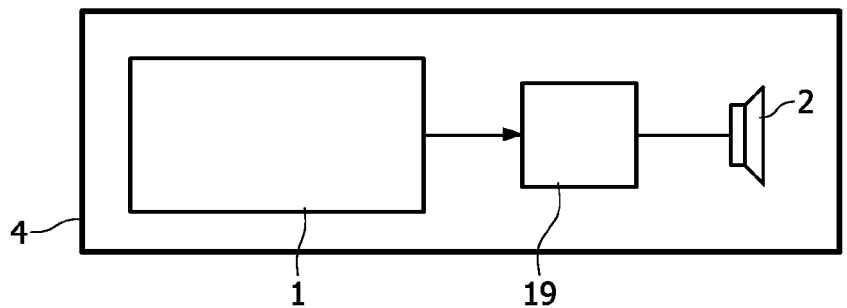
FIG. 8 schematically shows a consumer device according to the present invention.

The consumer device 4 according to the present invention which is schematically shown in FIG. 8 comprises a class D amplifier 1, a demodulation filter 19 and a loudspeaker 2. The consumer device, which may be portable, may further comprise a sound source, such as a DVD station or an MP3 memory unit (not shown).

The class D amplifier of the present invention may also be referred to as a push-pull amplifier or a switching amplifier, as the output voltage $V_{out}$ is switched between $+V_s$ ("pulled up to $+V_s$") and $-V_s$ ("pushed down to $-V_s$").

The present invention is based upon the insight that the correct operation of a class D amplifier can best be guaranteed by controlling the pulse width of the input signal of the amplifier. The present invention benefits from the further insight that the comparator signal can be advantageously used to control the pulse width of the input signal.

In summary the invention relates to a class D amplifier 1 comprises an input unit 11 for receiving a digital input signal $V_{in}$, a pulse shaping unit 12 for producing pulse shaped signals in dependence of the input signal $V_{in}$, a comparator unit 13 for comparing the pulse shaped signals and producing a comparator signal, a driver unit 14 for producing driver signals in dependence of the comparator signal, a switching output unit 15 for producing a pulse width modulated output signal $V_{out}$ in dependence of the driver signals, and a feedback unit 16 for feeding the output signal $V_{out}$ back to the pulse shaping unit 12. The input unit 11 comprises a clipping control unit 10 for controlling the duty cycle of the pulse width modulated output signal $V_{out}$.

It is noted that any terms used in this document should not be construed so as to limit the scope of the present invention. In particular, the words "comprise(s)" and "comprising" are not meant to exclude any elements not specifically stated. Single (circuit) elements may be substituted with multiple (circuit) elements or with their equivalents.

It will be understood by those skilled in the art that the present invention is not limited to the embodiments illustrated above and that many modifications and additions may be made without departing from the scope of the invention as defined in the appending claims.

The invention claimed is:

1. A class D amplifier arranged for
receiving a digital input signal, producing pulse shaped signals in dependence of the input signal, and a pulse width modulated output signal in dependence of the pulse shaped signals; further arranged for
feeding back the output signal for shaping the pulse shaped signals,
limiting the duty cycle of the pulse width modulated output signal by controlling the input signal by a clipping control unit;
wherein the clipping control unit is arranged for receiving an output indicator signal indicative of the output signal, and for delaying a transition of the input signal until the output indicator signal has responded to a previous transition of the input signal.

2. The amplifier according to claim 1, comprising:
an input unit for receiving the digital input signal,
a pulse shaping unit for producing the pulse shaped signals in dependence of the input signal,
a comparator unit for comparing the pulse shaped signals and producing a comparator signal,
a driver unit for producing driver signals in dependence of the comparator signal,
a switching output unit for producing the output signal in dependence of the driver signals, and
a feedback unit for feeding the output signal back to the pulse shaping unit,
wherein the input unit comprises the clipping control unit for limiting the duty cycle of the pulse width modulated output signal by controlling the input.

3. The amplifier according to claim 1, wherein the output indicator signal is identical to or derived from the comparator signal.

4. The amplifier according to claim 1, wherein the output indicator signal is identical to or derived from the output signal.

5. The amplifier according to claim 2, wherein the input unit further comprises a D/A converter.

6. The amplifier according to claim 2, wherein the clipping control unit comprises a state machine, a hysteresis loop or a logical circuit.

7. The amplifier according to claim 2, wherein the pulse shaping unit comprises at least one integrator.

8. The amplifier according to claim 2, further comprising a demodulation filter for demodulating the output signal.

9. A method of driving a class D amplifier capable of receiving a digital input signal and in which the output signal is fed back to shape pulses, the method comprising the step of limiting the duty cycle of the pulse width modulated output signal by controlling the input signal by receiving an output indicator signal indicative of the output signal, and delaying a transition of the input signal until the output indicator signal has responded to a previous transition of the input signal.

10. The method according to claim 9, wherein the digital input signal is a pulse density modulated or pulse width modulated input signal.

* * * * *